(12) United States Patent
Mori et al.

(10) Patent No.: US 6,977,857 B2
(45) Date of Patent: Dec. 20, 2005

(54) DRAM AND REFRESH METHOD THEREOF

(75) Inventors: Masaya Mori, Kawasaki (JP); Toshio Sunaga, Ohtsu (JP); Shinpei Watanabe, Yokohama (JP)

(73) Assignee: International Business Machines Corporation, Armonk, NY (US)

( * ) Notice: Subject to any disclaimer, the term of this patent is extended or adjusted under 35 U.S.C. 154(b) by 188 days.

(21) Appl. No.: 10/446,400

(22) Filed: May 28, 2003

(65) Prior Publication Data
US 2004/0001381 A1    Jan. 1, 2004

(30) Foreign Application Priority Data
May 28, 2002   (JP) ............................. 2002-153219

(51) Int. Cl.[7] .............................................. G11C 7/00
(52) U.S. Cl. .............. 365/222; 365/230.03; 365/225.7; 365/201
(58) Field of Search ........................... 365/222, 230.03, 365/225.7, 201, 200, 230.08

(56) References Cited

U.S. PATENT DOCUMENTS

| | | | | |
|---|---|---|---|---|
| 5,530,674 A | * | 6/1996 | McClure et al. | 365/201 |
| 5,596,535 A | * | 1/1997 | Mushya et al. | 365/200 |
| 6,208,570 B1 | * | 3/2001 | Brown et al. | 365/201 |
| 6,577,534 B2 | * | 6/2003 | Tsuruda | 365/185.09 |
| 6,760,806 B2 | * | 7/2004 | Jeon | 711/106 |

* cited by examiner

*Primary Examiner*—Connie C. Yoha
(74) *Attorney, Agent, or Firm*—Anthony J. Canale; Michael J. LeStrange (57) ABSTRACT

The present invention relates to a DRAM having a memory array that is divided into a plurality of memory blocks. A memory block having a long data retention time is selected from the plurality of memory blocks and a logical address is allocated to the selected memory block. The selected memory block is refreshed at longer time intervals compared to conventional DRAMs resulting in lower power consumption.

12 Claims, 6 Drawing Sheets

DRAM AND REFRESH METHOD THEREOF

BACKGROUND OF INVENTION

1. Field of the Invention

The present invention relates to a Dynamic Random Access Memory (DRAM) and a refresh method thereof, and more specifically, relates to a DRAM and refresh method thereof that enables reduction in data retention current.

2. Background of the Invention

In battery-driven devices such as portable telephones, it is important to reduce the power consumption of semiconductor devices used therein in order to extend battery life. With respect to memory devices such as, for example, Static Random Access Memories (SRAMs) having cells each composed of 6 transistors can retain data with low electrical current.

However, memory capacities required for SRAMs have been increasing and thus the technology with a ground rule of approximately 0.2 to 0.13 μm is impractical in the case of, for example, 32 Mb or 64 Mb SRAMs in as much as the chip sizes increase to an extreme extent. The memory capacities required by the battery-driven devices has been continually increasing.

DRAMs for replacing SRAMs have recently become available. However, DRAMs require refreshing of the memory cells. The standby current of the DRAMs in the state of retaining data is relatively larger than that of the SRAMs.

Figure 7:
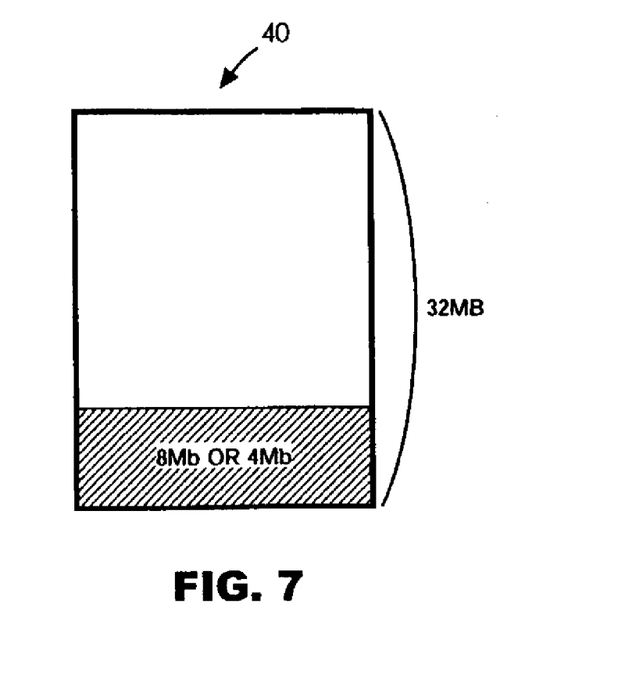
FIG. 7 shows the case wherein part of a memory array is refreshed according to a conventional refresh method.

DRAMs of the type having a mode wherein the data retention is limited to a minimum necessary number of cells and only that part is subjected to refreshing have become available. For example, as shown in FIG. 7, only 8 Mb or 4 Mb cells are refreshed in a 32 Mb memory array 40. Even in this case, the refresh of the 8 Mb or 4 Mb cells is constantly required and thus the consumption current is relatively larger compared to 8 Mb or 4 Mb SRAMs. It is not possible to totally replace the SRAMs with the DRAMs.

In devices such as portable telephones, there is such a type wherein a multi-chip package is used that is a combination of a large capacity DRAM (32 to 64 Mb) and a small-capacity low-current backup SRAM (4 to 8 Mb). However, even in this case, low price and low current is not achieved.

A DRAM with low power consumption and low cost that has a mode of refreshing only part of the memory cells, thereby eliminating the need for SRAM, and further provide a refresh method thereof is desired.

SUMMARY OF THE INVENTION

It is an object of the present invention to provide a DRAM with low power consumption and of low cost that has a mode of refreshing only part of the whole memory cells, thereby to unnecessitate an SRAM, and further provide a refresh method thereof.

A DRAM of the present invention is such that a memory array is divided into a plurality of memory blocks and, for selecting the memory block with a long retention time, a circuit is included that receives an address generating signal and a selection signal for the memory blocks and allocates a logical address to the memory block selected by the selection signal. Although a physical address of a memory block to be refreshed differs per DRAM, a logical address thereof can be constant among all DRAMs.

A refresh method for a DRAM of the present invention is such that a memory array is divided into a plurality of memory blocks and, for refreshing the memory block with a long retention time, the method comprises a step of selecting the memory block from the plurality of memory blocks, the memory block including only such cells each having a long data retention time, and a step of allocating a logical address to the selected memory block.

DETAILED DESCRIPTION

Preferred embodiments of a DRAM and a refresh method thereof according to the present invention will be described with reference to the drawings.

Before describing the embodiments of the present invention, the characteristic of data retention of a DRAM will be discussed. In general, there is a data retention specification of, for example, 64 ms for DRAMs, so that those devices using DRAMs are required to refresh each of the memory cells within the specified data retention time. Manufacturers of DRAMs conduct a test with a retention time leaving a margin to the specification and ship the acceptable products. Those cells each having a retention time that is very close to the acceptable level of the shipping test are mainly related to some defects. The total number of such cells is not many, and the ratio of them relative to the number of cells of the whole chip is very small.

Figure 5:
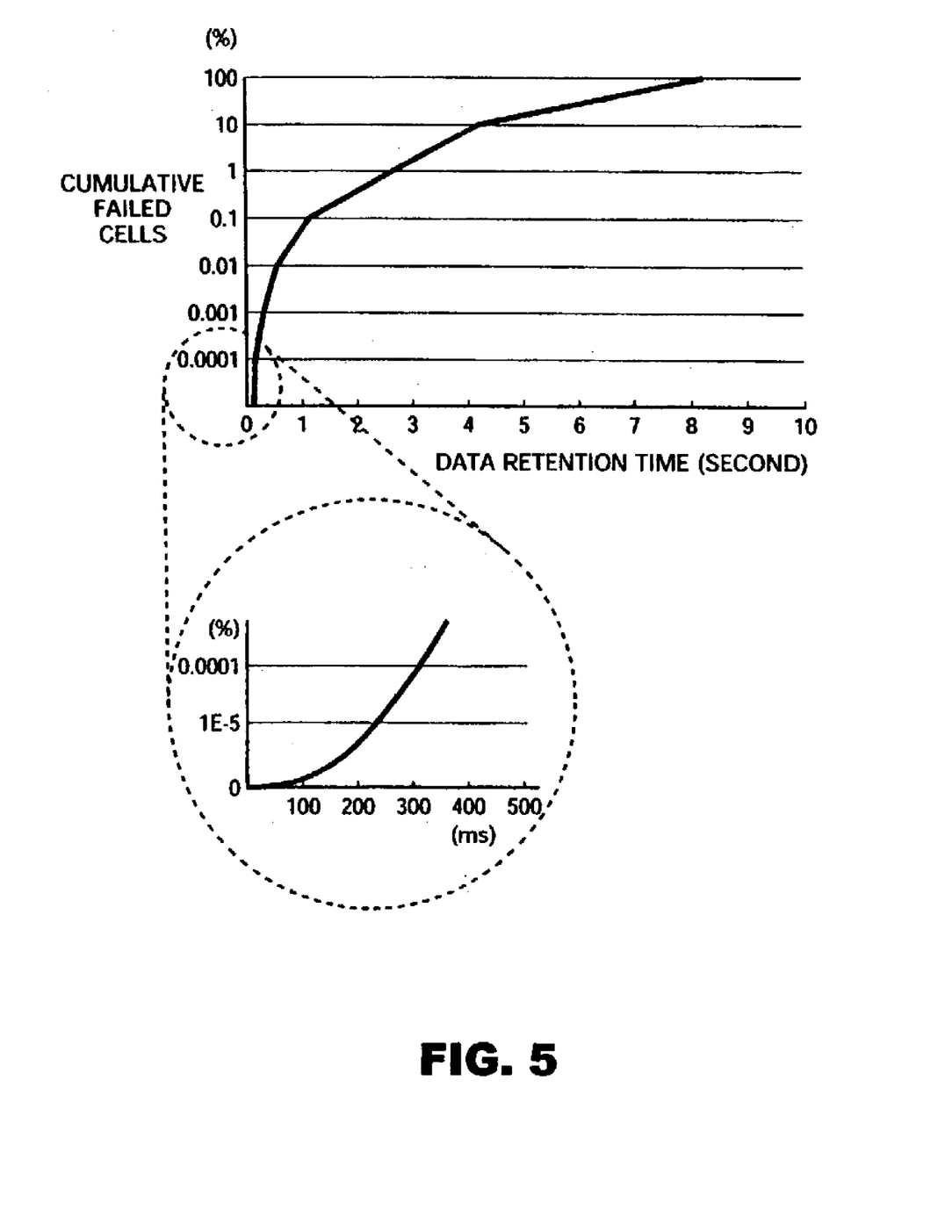
FIG. 5 shows the distribution of data retention times of memory cells according to the present invention.

According to the data retention time distribution of a normal DRAM, most cells have data retention times on the order of seconds in a test conducted at 85° C. For example, in 32 Mb or 64 Mb, only approximately several tens of bits do not clear the criterion value of the shipping test such as 100 ms given a margin relative to 64 ms. The cumulative data retention time distribution is as shown in FIG. 5, wherein 99% or more of the cells have data retention times longer than one second, with the remaining cells spreading over a region of shorter data retention times.

The present invention utilizes the characteristic of the foregoing data retention time distribution of the DRAM and, in a DRAM having a mode of refreshing only a part thereof, realizes the reduced power consumption by collecting cells with long data retention times to form that part to be refreshed. As an example, a 32 Mb DRAM is described. Explanation will be made of a case wherein 8 Mb cells are selected by collecting cells with long data retention times. If only such long data retention 8 Mb cells are refreshed, it is sufficient to perform the refresh at a very long period. Thus, the data retention current can be significantly reduced.

Figure 6:
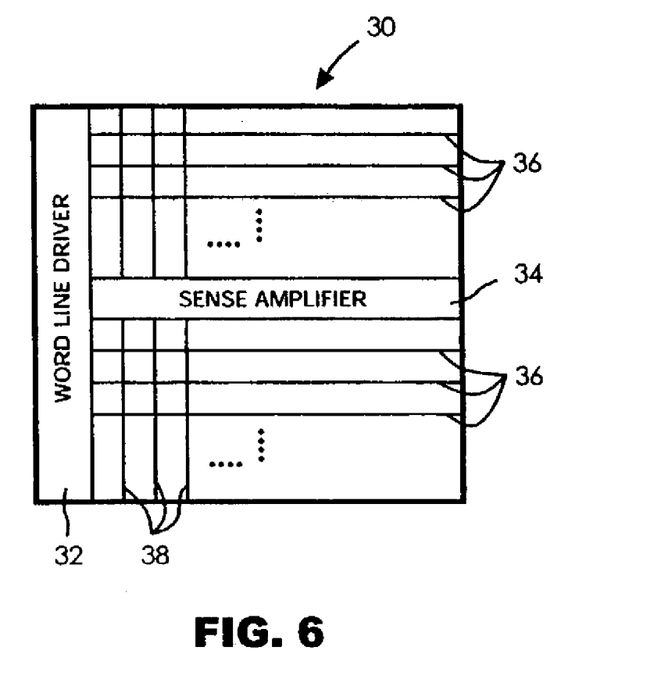
FIG. 6 shows a configuration of a block of a memory array according to the present invention.

Practically, it is difficult to collect only the cells whose data retention is long. In the present invention, the refresh is implemented with respect to a block composed of a group 30 of cells connected to word lines 36 and bit lines 38 operated by a word line driver 32 and a sense amplifier 34, respectively, as shown in FIG. 6, or composed of a given number of the groups 30.

Figure 1:
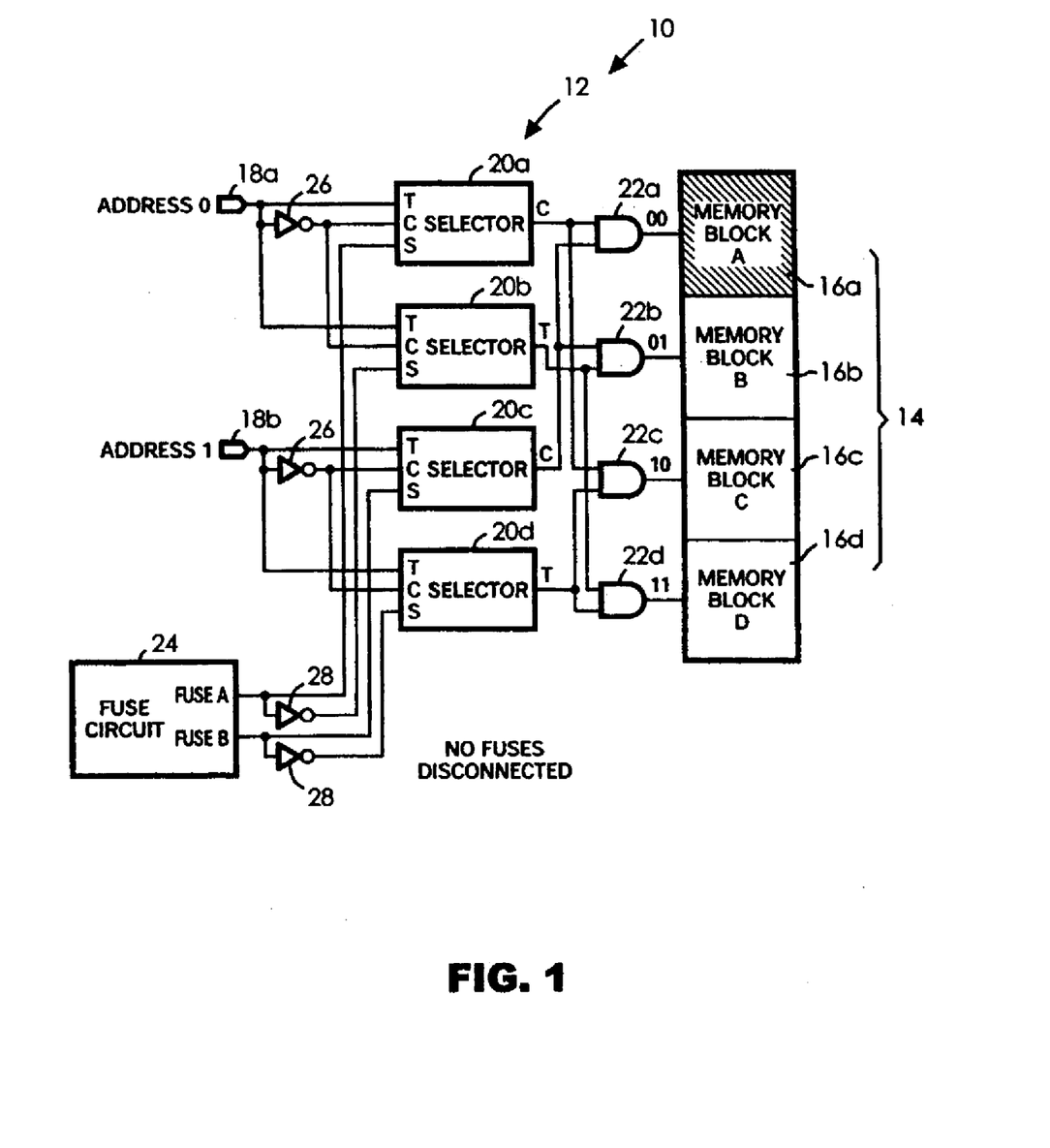
FIG. 1 shows a configuration of a DRAM according to the present invention.

FIG. 1 shows a configuration of a DRAM 10 according to one embodiment of the present invention. A memory array 14 is divided into four memory blocks A–D 16a, 16b, 16c and 16d. A test is conducted with respect to each of the memory blocks A–D 16a, 16b, 16c and 16d using a long data retention time that is, for example, two or four times a data retention time of the normal shipping test such as 64 to 100 ms. The memory block that has cleared such a long retention time is used as a portion to be refreshed. Assuming that the whole memory capacity is 32 Mb, the capacity of one memory block having passed the long retention time test is 8 Mb.

Since a physical address of a memory block that passes the long retention time test is not determined among respective DRAMs 10, the physical address of the memory block to be refreshed differs per DRAM 10. As this is inconvenient upon use, it is configured to allocate the same logical address to the memory block to be refreshed among the respective DRAMs 10. To accomplish this, an address decode circuit 12 as described below is provided. Inasmuch as a memory block is selected by a physical address in the present invention, hereinafter referred to as "address", it represents a logical address.

The address decode circuit 12 comprises terminals 18a and 18b inputted with an address of the memory block 16a, 16b, 16c or 16d to be refreshed, selectors 20a, 20b, 20c and 20d each for selecting T (True) or C (Complement) of the address, and a circuit for selecting the memory block to be refreshed based on signals of T and C of the address outputted from the selectors 20a, 20b, 20c and 20d.

Each of addresses that determine the four blocks is composed of two bits, and each bit is represented by an address 0 or an address 1 as an address generating signal. In this embodiment, a logical address of the memory block to be refreshed is set as "00".

The address 0 is input to the terminal 18a and to the selectors 20a and 20b in a bifurcate manner. Similarly, the address 1 is input to the terminal 18b and to the selectors 20c and 20d in a bifurcate manner. In FIG. 1, T and C of each of the selectors 20a, 20b, 20c and 20d are input with T and C of the inputted addresses, respectively. For generating C, a NOT circuit 26 is provided between the terminal 18a and C of the selectors 20a and 20b, and a NOT circuit 26 is provided between the terminal 18b and C of the selectors 20c and 20d. T and C of the address are simultaneously input into each of the selectors 20a, 20b, 20c and 20d. In this embodiment, since the logical address of the memory block to be refreshed is "00", T and C become "0" and "1", respectively.

As a circuit that generates a selection signal for selecting the signal of T or C in each of the selectors 20a, 20b, 20c and 20d, a fuse circuit 24 is provided. The fuse circuit 24 comprises two fuses A and B. An output of each of the fuses A and B is connected to S of the corresponding two selectors. The fuse circuit 24 is like a redundant circuit used in a normal DRAM or the like and is provided with fuses such as, for example, polysilicon or the like. An output of the fuse circuit 24 via the fuse A is "0" when the fuse A is not disconnected, while it is "1" when the fuse A is disconnected. Similarly, an output of the fuse circuit 24 via the fuse B is "0" when the fuse B is not disconnected, while it is "1" when the fuse B is disconnected.

Each of the selectors 20a, 20b, 20c and 20d outputs C when S is "0" while T is output when S is "1". Each fuse is connected to the corresponding two selectors in a bifurcate manner. It is configured that outputs of these two selectors become contrary to each other. Therefore, as shown in the figure, a NOT circuit 28 is disposed between the fuse A and the selector 20b so that selection signals to the selectors 20a and 20b become contrary to each other. This also applies to the fuse B.

As the circuit for selecting the memory block 16a, 16b, 16c or 16d to be refreshed, AND circuits 22a, 22b, 22c and 22d are provided. The number of the AND circuits 22a, 22b, 22c and 22d is equal to the number of the memory blocks A-D 16a, 16b, 16c and 16d. Each of the AND circuits 22a, 22b, 22c and 22d receives the signal of T and/or the signal of C from the predetermined two of the selectors 20a, 20b, 20c and 20d. When the inputs to the AND circuit 22a, 22b, 22c or 22d are both C, an output of that AND circuit represents the logical address "00". In FIG. 1, since either of the fuses A and B is not disconnected, an output of each of the selectors 20a and 20c becomes C. Accordingly, the physically uppermost memory block A 16a is allocated the logical address "00". Specifically, the memory block A 16a is selected as a memory block that has passed the long retention time test and given the logical address "00".

Figure 2:
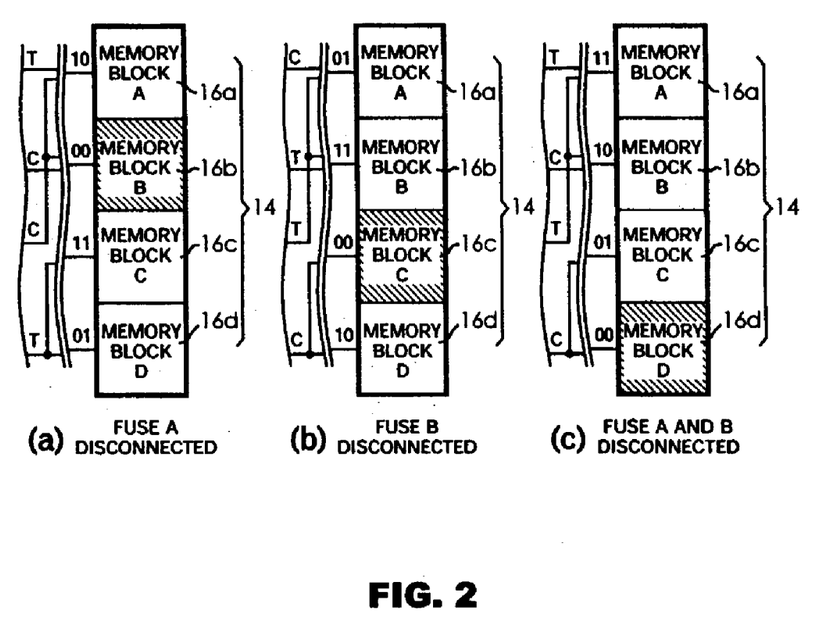
FIGS. 2A–C shows various cases of fuse disconnection in the DRAM of FIG. 1.

FIG. 2A shows a case wherein the memory block B 16b becomes a memory block that has passed the long time retention test. For allocating the logical address "00" to the memory block B 16b, T and C of the address 0 are exchanged with each other. For accomplishing it, the fuse A is disconnected to change outputs of the selectors 20a and 20b. In this event, all logical addresses of the memory blocks other than the memory block A 16a are also changed, and the logical address of the memory block B 16b becomes "00" so that the memory block B 16b is refreshed.

FIGS. 2B and 2C show cases wherein the memory blocks C–D 16c and 16d become memory blocks that have passed the long time retention test, respectively. The fuse B is disconnected in FIG. 2B, while the fuses A and B are disconnected in FIG. 2C, so that a memory block that has passed the long time retention test is given the logical address "00" in each of the cases.

As described above, by providing the selectors 20a, 20b, 20c and 20d and the fuse circuit 24, the logical address to be refreshed is held the same. Specifically, even if a physical address of a memory block to be refreshed is changed per DRAM 10, a logical address thereof is held the same so that it is not necessary to change a logical address to be refreshed per DRAM 10. Therefore, with respect to any of the DRAMs 10, by inputting the same address generating signal to the terminals 18a and 18b of the address decode circuit 12, a memory block that has passed the long retention time test can be refreshed.

To summarize the method of selecting a memory block to be refreshed, (1) T and C of an address of the memory block 16a, 16b, 16c or 16d to be selected are inputted to each of the selectors 20a, 20b, 20c and 20d; (2) The fuse circuit 24 produces a selection signal for selecting T or C of the address in each of the selectors 20a, 20b, 20c and 20d; (3) Each of the selectors 20a, 20b, 20c and 20d selects T or C of the address using the selection signal; and (4) Based on selected T and C, the AND circuits 22a, 22b, 22c and 22d select the memory block 16a, 16b, 16c or 16d to be refreshed.

In step (2), the selection signal is determined depending on whether or not the fuse A, B is disconnected. In step (4), only one of the AND circuits 22a, 22b, 22c and 22d differs in output, and the memory block connected to that AND circuit is selected.

FIG. 1 shows the quarter refresh wherein the 32 Mb memory array is divided into four 8 Mb memory blocks. On the other hand, each memory block may be further divided into a plurality of blocks. In this case, although it is also the quarter refresh, the probability of picking out a group of cells that have passed a longer retention time test such as, for example, a group of cells having data retention times of no less than one second, can be increased.

Figure 3:
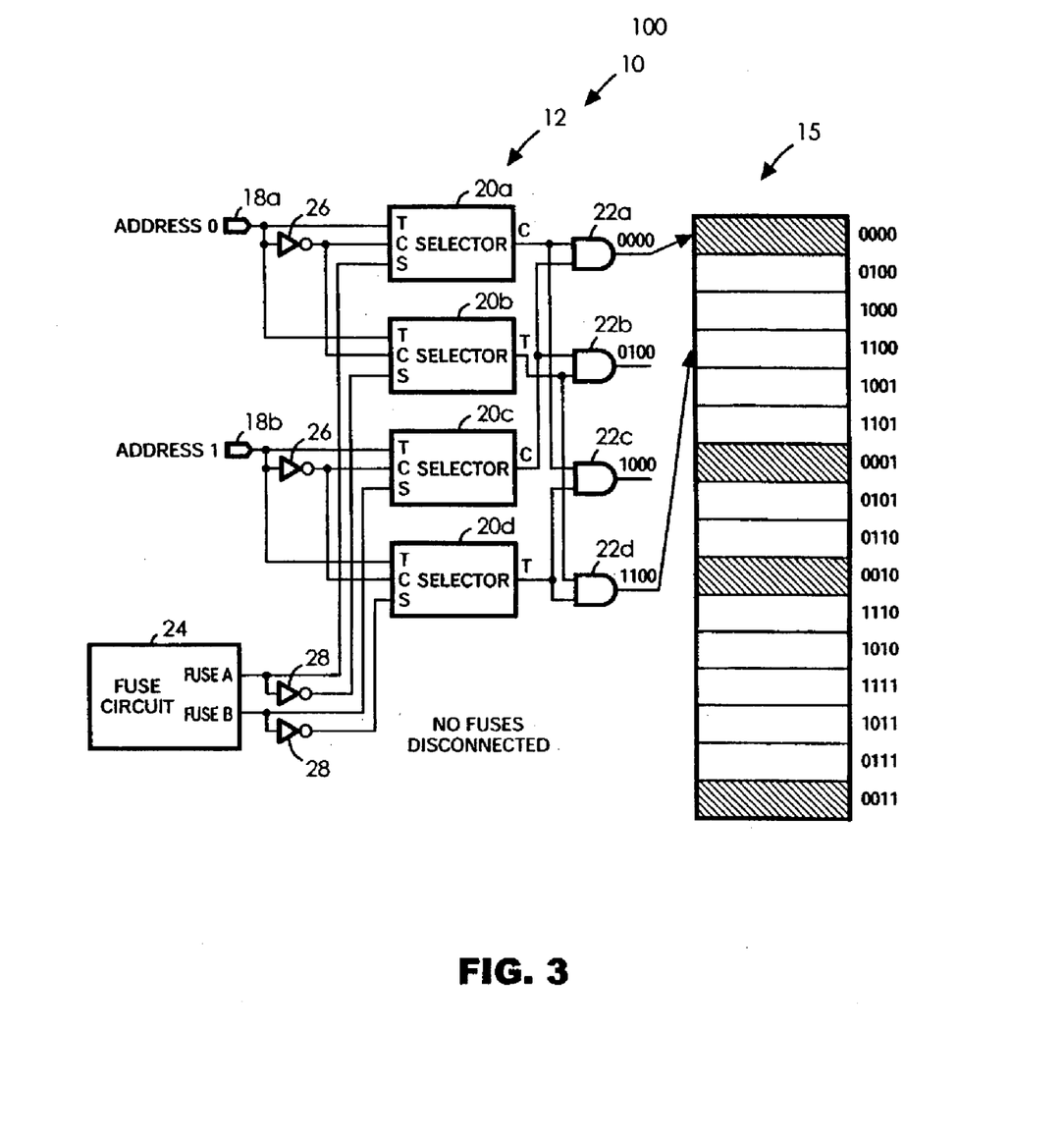
FIG. 3 shows a configuration of a DRAM according to the present invention, wherein a memory array is subjected to 4—4 division.

FIG. 3 shows a 4—4 division configuration according to a second embodiment of the present invention. A memory array 15 is divided into four larger blocks and each larger block is further divided into four smaller blocks. Accordingly, the memory array 15 is divided into 16 smaller blocks in total. In this embodiment, one smaller block to be refreshed is selected from each larger block, so that a quarter of the whole memory array 15 is refreshed in total as in the embodiment of FIG. 1. In FIG. 3, the address decode circuit 12 shown in FIG. 1 is provided for each larger block. That is, in this embodiment, four address decode circuits 12 each corresponding to the address decode circuit 12 shown in FIG. 1 are provided.

Figure 4:
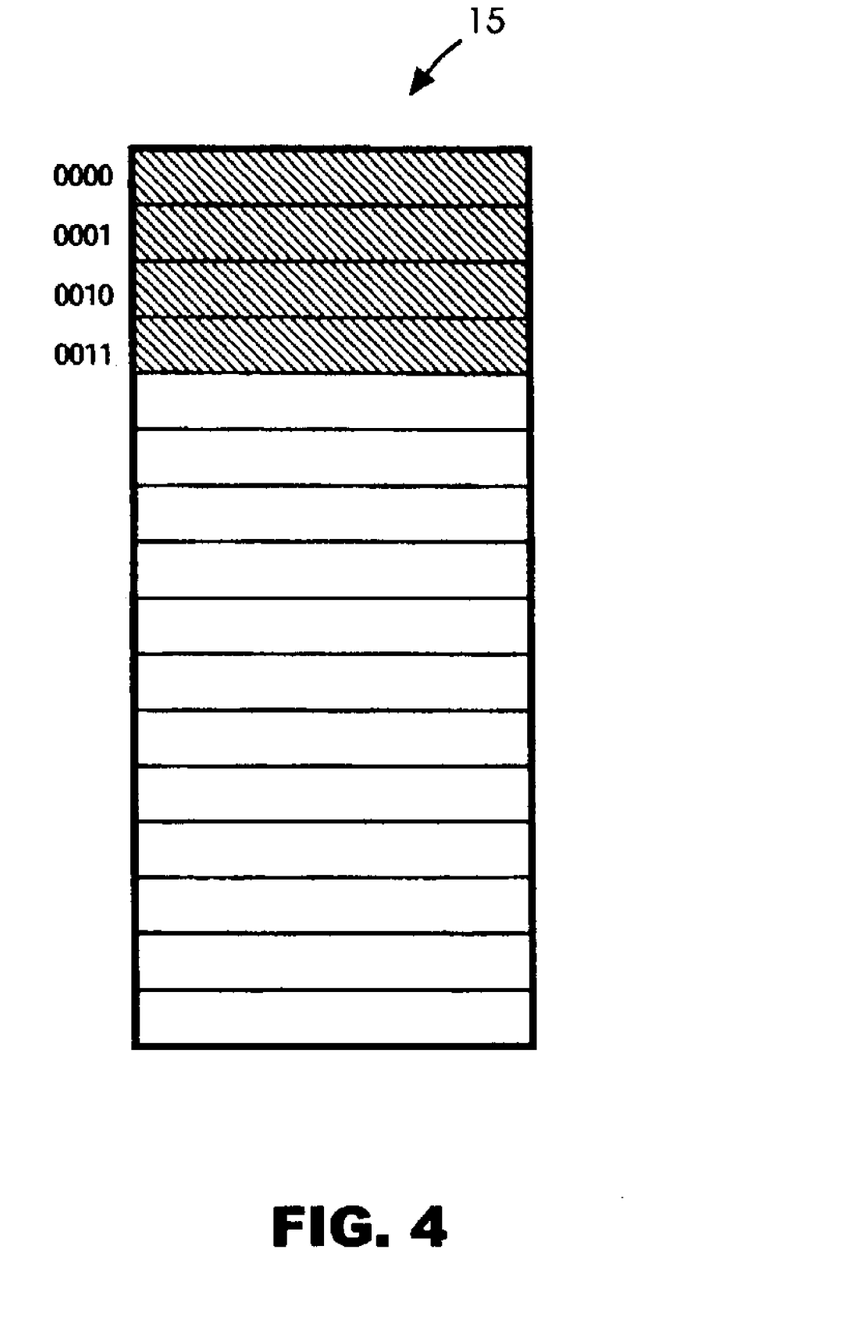
FIG. 4 shows the state of logical addresses of the DRAM shown in FIG. 3.

A 4-bit address is necessary for identifying each smaller block, wherein the lower two bits are used for identifying each larger block and the upper two bits are used for identifying each smaller block. Among the four smaller blocks in each larger block, a logical address of the smaller block that has passed the long retention time test is changed to "00". Accordingly, in terms of physical addresses, the blocks that have passed the long retention time test are located in the larger blocks in a discontinuous manner as shown in. FIG. 3, while in terms of logical addresses, a group of continuous addresses is constantly formed as shown in FIG. 4.

The embodiments of the present invention described with reference to FIGS. 1 and 3 relate to quarter refresh. Those cells each having a short data retention time are located in any places of the memory array 14 or 15. Therefore, there are instances where one memory block that has passed the long retention time test can not be obtained from among the four memory blocks as shown in FIG. 1. It is easier to obtain four smaller blocks that have passed the long retention time test, from the 16 smaller blocks as shown in FIG. 3. In general, when a memory array is quartered, it is easier to obtain a block that has passed the long retention time test. In the case of 4-N division, N is an integer.

In the case of 1/X refresh where a memory block to be refreshed is 1/X of a memory array, such as ⅛ or 1/16 refresh, other than the quarter refresh, X-N division (X and N are each an integer) is also possible. In this event, as N increases, the probability of obtaining a block that has passed the long retention time test increases, and further, the probability of obtaining such a block with a longer retention time increases. In the case of 32 Mb as an example, assuming that a word line has a length corresponding to a 2K bit line pair, the number of word lines is 16K and, assuming that a typical bit line length corresponds to 512 word lines, 32 blocks each of 512×2K can be obtained. Accordingly, N can be easily set to 32. Further, if a word line or a bit line is shortened, N can even be 64 to 256. Since N can take a large value as described above, the present technique can provide effective means for achieving reduced consumption current in a refresh mode for a 1/X memory block. Therefore, there can be provided a battery-driven device having a semiconductor device with low power consumption and of low cost in the form of a DRAM single chip without using a backup SRAM.

According to the embodiments of the present invention, the selection of T or C of the address in each of the selectors 20a, 20b, 20c and 20d is implemented based on the disconnection or non-disconnection state of the fuse A, B. However, instead of using the fuse circuit 24, it may also be configured to use a latch circuit to retain data of "0" or "1", and further use a circuit for loading such data into each of the selectors 20a, 20b, 20c and 20d, thereby to carry out logical address conversion. When this type of electrical means is used, any conversion can be achieved.

In the foregoing embodiments, the logical address to be refreshed is set as "00". However, other addresses may be used.

According to the present invention, in a mode of refreshing only part of the whole memory of a DRAM chip, a test is conducted for each of fractionized memory blocks, and the blocks composed of cells with long data retention are collected up to a necessary capacity so as to form a portion of the whole memory that requires refreshing. This makes it possible to largely reduce data retention current in the partial refresh mode, based on the long data retention time. The present invention enables a data retention time to be no less than one second, and further enables the power consumption to be no greater than about one tenth as compared with the conventional DRAM refresh method.

While the invention has been described above with reference to the preferred embodiments thereof, it is to be understood that the spirit and scope of the invention is not limited thereby. Rather, various modifications may be made to the invention as described above without departing from the overall scope of the invention as described above and as set forth in the several claims appended hereto.

What is claimed is:

1. A DRAM comprising:
   a memory array divided into a plurality of memory blocks, wherein a nominal data retention period is determined for each of the plurality of memory blocks; and
   a circuit for selecting a first memory block for refreshing from said plurality of memory blocks, the first memory block having a data retention period that is at least twice the nominal data retention period.

2. The DRAM according to claim 1, wherein said circuit allocates a logical address to the memory block.

3. The DRAM according to claim 1, wherein said circuit comprises:
   a generator for generating a selection signal;
   a first selector for selecting true or complement of an address generating signal based on said selection signal; and
   a second selector for selecting the memory block based on true or complement of said address generating signal selected by said first selector.

4. The DRAM according to claim 3, wherein the generator comprises a fuse circuit.

5. The DRAM according to claim 4, wherein a NOT circuit is disposed between said fuse circuit and said first selector.

6. The DRAM according to claim 3, further comprising:
   a terminal inputted with said address generating signal; and
   a NOT circuit disposed between said terminal and said first selector.

7. The DRAM according to claim 3, wherein said first selector comprises AND circuits.

8. The DRAM according to claim 7, wherein said AND circuits are provided correspondingly to said memory blocks, respectively.

9. A method of refreshing a DRAM, the DRAM divided into a plurality of memory blocks, the method comprising the steps of:
- determining a nominal data retention period for each of the plurality of memory blocks;
- selecting a first memory block for refreshing from said plurality of memory blocks, said first memory block including only such cells each having a data retention period that is at least twice the nominal data retention period; and
- allocating a logical address to said selected memory block.

10. The method according to claim 9, wherein said selecting step comprises the steps of:
- receiving an address generating signal for the memory blocks;
- receiving a selection signal for the memory blocks; and
- selecting true or complement of said address generating signal.

11. The method according to claim 10, further comprising a step of inverting said address generating signal.

12. The method according to claim 10, further comprising a step of inverting said selection signal.

* * * * *